(12) United States Patent
Ninomiya et al.

(10) Patent No.: US 11,005,452 B2
(45) Date of Patent: May 11, 2021

(54) IMPEDANCE TUNER AND SIGNAL AMPLIFICATION DEVICE

(71) Applicant: Mitsubishi Electric Corporation, Tokyo (JP)

(72) Inventors: Dai Ninomiya, Tokyo (JP); Eigo Kuwata, Tokyo (JP); Hiroyuki Nonomura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 50 days.

(21) Appl. No.: 16/609,847

(22) PCT Filed: May 24, 2017

(86) PCT No.: PCT/JP2017/019372
§ 371 (c)(1),
(2) Date: Oct. 31, 2019

(87) PCT Pub. No.: WO2018/216140
PCT Pub. Date: Nov. 29, 2018

(65) Prior Publication Data
US 2020/0076408 A1 Mar. 5, 2020

(51) Int. Cl.
*H03F 3/191* (2006.01)
*H03H 11/28* (2006.01)
*H01P 1/18* (2006.01)
*H03F 1/56* (2006.01)
*H03F 3/21* (2006.01)
*H03F 3/58* (2006.01)

(52) U.S. Cl.
CPC .............. *H03H 11/28* (2013.01); *H01P 1/18* (2013.01); *H03F 1/56* (2013.01); *H03F 3/21* (2013.01); *H03F 3/58* (2013.01); *H03F 2200/423* (2013.01)

(58) Field of Classification Search
CPC ........................................................ H03F 3/191
USPC .................................................. 330/305, 302
See application file for complete search history.

(56) References Cited

U.S. PATENT DOCUMENTS 4,321,706 A * 3/1982 Craft .................... H03C 3/0941
375/295

FOREIGN PATENT DOCUMENTS

JP 2003-318689 A 11/2003

OTHER PUBLICATIONS

Muguira et al., "Automatic Tuner Unit Design, Simulation and Measurement for Automatic Operation of the RF System in the ESS-BILBAO H+ Ion Source," Proceedings of IPAC2011, San Sebastian, Spain, THPS023, 2011, pp. 3469-3471.

* cited by examiner

*Primary Examiner* — Henry Choe
(74) *Attorney, Agent, or Firm* — Birch, Stewart, Kolasch & Birch, LLP

(57) ABSTRACT

A control circuit (16) is configured to detect the impedance P1 of a load (3) and control each of the reactance value L1 of a first variable reactance element (12), the reactance value L2 of a second variable reactance element (14), and the phase shift amount φ of a phase shifter (15) on the basis of the detected impedance P1. Consequently, impedance matching can be achieved even with the phase shifter (15) that performs discrete phase shift control.

6 Claims, 5 Drawing Sheets

| P1 | L1 | L2 | φ |
|---|---|---|---|
| $P1_a$ | $L1_a$ | $L2_a$ | $φ_a$ |
| $P1_b$ | $L1_b$ | $L2_b$ | $φ_b$ |
| ⋮ | ⋮ | ⋮ | ⋮ |
| $P1_z$ | $L1_z$ | $L2_z$ | $φ_z$ |

IMPEDANCE TUNER AND SIGNAL AMPLIFICATION DEVICE

TECHNICAL FIELD

The present invention relates to an impedance tuner and a signal amplification device including variable reactance elements and a phase shifter.

BACKGROUND ART

Mechanically controlled impedance tuners are capable of matching the impedance of a signal source and the impedance of a load by driving a slug in a waveguide using a motor.

Mechanically controlled impedance tuners need a lot of time to completely drive the slug.

Patent Literature 1 below discloses an electronically controlled impedance tuner as a compact impedance tuner that operates faster than mechanically controlled impedance tuners.

The impedance tuner disclosed in Patent Literature 1 includes a variable reactance element and a phase shifter.

The phase shifter of the impedance tuner controls the phase of a signal from a signal source to a load connected to the impedance tuner in a manner as to move the impedance of the load to a point on a constant conductance circle passing through the 50Ω point of the Smith chart.

The variable reactance element of the impedance tuner achieves impedance matching by transforming the impedance at the point on the constant conductance circle to 50Ω.

CITATION LIST

Patent Literatures

Patent Literature 1: JP 2003-318689 A

SUMMARY OF INVENTION

Technical Problem

Since the conventional impedance tuner is configured as described above, if the phase shifter can accurately move the impedance of the load to a point on the constant conductance circle passing through the 50Ω point of the Smith chart, the impedance of the signal source and the impedance of the load can be matched. However, because the phase shifter performs discrete phase shift control in principle, the impedance might be likely to reach some point other than the point on the constant conductance circle passing through a point having 50Ω in the Smith chart after phase shift control. There is a problem in that the accuracy of matching between the impedance of the signal source and the impedance of the load is degraded.

FIG. 6 is an explanatory diagram illustrating a state in which the impedance of a signal source and the impedance of a load are sufficiently matched.

In the example of FIG. 6, the impedance P1 of the load is present on a constant reflection coefficient circle R1.

By controlling the phase of a signal output from the signal source to the load, the phase shifter moves the impedance P1 of the load to a point P2 on a constant conductance circle R2 passing through a point P3 having 50Ω in the Smith chart.

The variable reactance element transforms the impedance at the point P2 on the constant conductance circle R2 to the point P3.

FIG. 7 is an explanatory diagram illustrating a state in which the accuracy of matching between the impedance of a signal source and the impedance of a load is degraded.

Because the phase shifter performs discrete phase shift control in principle, the impedance might reach a point P4 within some phase range, which is shifted to the point P2 on the constant conductance circle R2 after the phase shifter performs phase shift control.

When the variable reactance element transforms the impedance that is shifted to the point P2, a mismatch occurs by the range of R3.

The present invention has been made to solve the above problems, and an object thereof is to obtain an impedance tuner and a signal amplification device capable of achieving impedance matching even with a phase shifter that performs discrete phase shift control.

Solution to Problem

An impedance tuner according to the present invention includes: a first transmission line connected at one end thereof to an output end of a signal source and having an electrical length of a quarter wavelength at a frequency of a signal output from the signal source; a first variable reactance element connected at one end thereof to another end of the first transmission line; a second transmission line connected at one end thereof to another end of the first variable reactance element and having an electrical length of a quarter wavelength at the frequency of the signal; a second variable reactance element connected at one end thereof to another end of the second transmission line; a phase shifter, connected at one end thereof to another end of the second variable reactance element, to shift a phase of the signal and output a phase-shifted signal to a load; and a control circuit to detect an impedance of the load and control each of reactance values of the first and second variable reactance elements and a phase shift amount of the phase shifter on a basis of the impedance.

Advantageous Effects of Invention

According to the present invention, because the control circuit is configured to detect the impedance of the load and control each of the reactance values of the first and second variable reactance elements and the phase shift amount of the phase shifter on the basis of the detected impedance, the present invention is effective in achieving impedance matching even with the phase shifter that performs discrete phase shift control.

BRIEF DESCRIPTION OF DRAWINGS

FIG. 2 is an explanatory diagram illustrating the operation principle of the impedance tuner 2 in FIG. 1.

FIG. 3 is an explanatory diagram illustrating an example of a table 19a.

DESCRIPTION OF EMBODIMENTS

Hereinafter, in order to explain the present invention in more detail, embodiments for carrying out the present invention will be described with reference to the accompanying drawings.

First Embodiment

Figure 1:
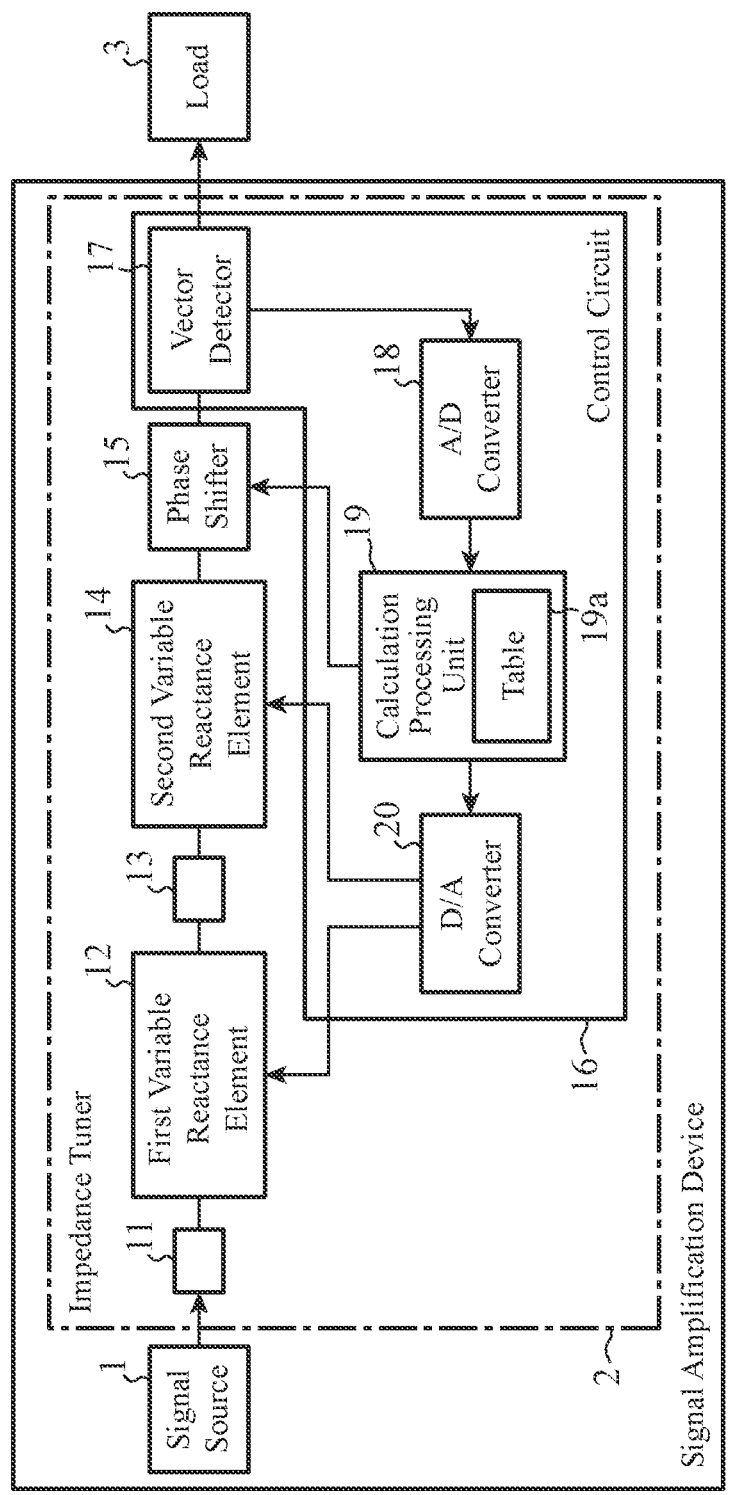
FIG. 1 is a configuration diagram illustrating a signal amplification device including an impedance tuner according to a first embodiment of the present invention.

FIG. 1 is a configuration diagram illustrating a signal amplification device including an impedance tuner according to the first embodiment of the present invention.

In FIG. 1, a signal source 1 is an amplifier such as a traveling wave tube amplifier (TWTA) or a solid state power amplifier (SSPA), for example, and outputs an amplified signal to the impedance tuner 2.

The impedance tuner 2 is a device for matching the impedance of the signal source 1 and the impedance of a load 3.

The load 3 is a load whose impedance P1 is unknown.

A first transmission line 11 is a transmission line connected at one end thereof to the output end of the signal source 1 and having an electrical length of a quarter wavelength at the frequency of a signal output from the signal source 1.

A first variable reactance element 12 is a variable reactance element connected at one end thereof to the other end of the first transmission line 11.

A second transmission line 13 is a transmission line connected at one end thereof to the other end of the first variable reactance element 12 and having an electrical length of a quarter wavelength at the frequency of a signal output from the signal source 1.

A second variable reactance element 14 is a variable reactance element connected at one end thereof to the other end of the second transmission line 13.

A phase shifter 15 is connected at one end thereof to the other end of the second variable reactance element 14, shifts the phase of a signal having passed through the second variable reactance element 14, and outputs the phase-shifted signal.

A control circuit 16 includes a vector detector 17, an A/D converter 18, a calculation processing unit 19, and a D/A converter 20.

The control circuit 16 is a circuit that detects the impedance P1 of the load 3 and controls each of the reactance value L1 of the first variable reactance element 12, the reactance value L2 of the second variable reactance element 14, and the phase shift amount φ of the phase shifter 15 on the basis of the impedance P1.

The vector detector 17 detects the impedance P1 of the load 3 and outputs a detection signal indicating the detected impedance P1 to the A/D converter 18.

The A/D converter 18 is an analog-to-digital converter that converts the analog detection signal output from the vector detector 17 to a digital signal and outputs the digital detection signal to the calculation processing unit 19.

The calculation processing unit 19 includes a table 19a indicating the relationship between the impedance P1 of the load 3, the reactance value L1 of the first variable reactance element 12, the reactance value L2 of the second variable reactance element 14, and the phase shift amount φ of the phase shifter 15.

With reference to the table 19a, the calculation processing unit 19 determines each of the reactance value L1 of the first variable reactance element 12, the reactance value L2 of the second variable reactance element 14, and the phase shift amount φ of the phase shifter 15 corresponding to the impedance P1 indicated by the digital detection signal output from the A/D converter 18.

The calculation processing unit 19 outputs, to the D/A converter 20, a control signal C1 indicating the determined reactance value L1 and a control signal C2 indicating the reactance value L2.

The calculation processing unit 19 also outputs, to the phase shifter 15, a control signal C3 indicating the determined phase shift amount φ.

The D/A converter 20 is a digital-to-analog converter that converts the digital control signals C1 and C2 output from the calculation processing unit 19 to analog signals.

The D/A converter 20 outputs the analog control signal C1 to the first variable reactance element 12 and outputs the analog control signal C2 to the second variable reactance element 14.

Next, the operation will be described.

Figures 2, 3:
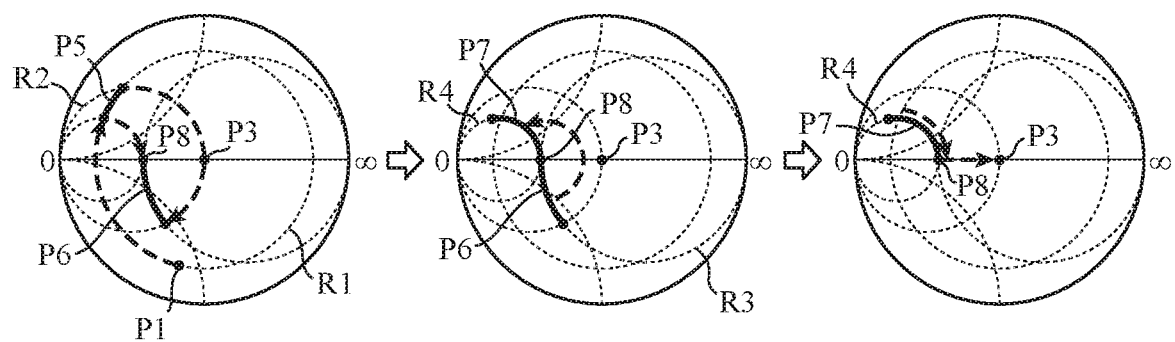

FIG. 2 is an explanatory diagram illustrating the operation principle of the impedance tuner 2 in FIG. 1.

The vector detector 17 of the control circuit 16 detects the impedance P1 of the load 3 and outputs a detection signal indicating the detected impedance P1 to the A/D converter 18.

In the example of FIG. 2, the impedance P1 of the load is present on the constant reflection coefficient circle R1. The size of the constant reflection coefficient circle R1 varies depending on the impedance P1 of the load detected by the vector detector 17.

The A/D converter 18 of the control circuit 16 converts the analog detection signal output from the vector detector 17 to a digital signal, and outputs the digital detection signal to the calculation processing unit 19.

The calculation processing unit 19 of the control circuit 16 includes the table 19a indicating the relationship between the impedance P1 of the load 3, the reactance value L1 of the first variable reactance element 12, the reactance value L2 of the second variable reactance element 14, and the phase shift amount φ of the phase shifter 15.

FIG. 3 is an explanatory diagram illustrating an example of the table 19a.

With reference to the table 19a, the calculation processing unit 19 determines each of the reactance value L1 of the first variable reactance element 12, the reactance value L2 of the second variable reactance element 14, and the phase shift amount φ of the phase shifter 15 corresponding to the impedance P1 indicated by the digital detection signal output from the A/D converter 18.

In the example of FIG. 3, if the impedance P1 of the load 3 is $P1_a$, $L1_a$ is selected as the reactance value L1 of the first variable reactance element 12, $L2_a$ is selected as the reactance value L2 of the second variable reactance element 14, and $\varphi_a$ is selected as the phase shift amount φ of the phase shifter 15.

If the impedance P1 of the load 3 is $P1b$, $L1_b$ is selected as the reactance value L1 of the first variable reactance element 12, $L2_b$ is selected as the reactance value L2 of the second variable reactance element 14, and $\varphi_b$ is selected as the phase shift amount φ of the phase shifter 15.

The calculation processing unit 19 outputs, to the D/A converter 20, the control signal C1 indicating the determined reactance value L1 and the control signal C2 indicating the reactance value L2.

The calculation processing unit 19 also outputs, to the phase shifter 15, the control signal C3 indicating the determined phase shift amount φ.

The D/A converter 20 of the control circuit 16 converts the digital control signals C1 and C2 output from the calculation processing unit 19 to analog signals.

The D/A converter 20 outputs the analog control signal C1 to the first variable reactance element 12 and outputs the analog control signal C2 to the second variable reactance element 14.

The phase shifter 15 shifts the phase of a signal having passed through the second variable reactance element 14 by the phase shift amount φ indicated by the control signal C3 output from the calculation processing unit 19.

Because the phase shifter 15 performs discrete phase shift control, the impedance is put in the phase range of a region P5 after the phase shifter 15 performs phase shift control.

Therefore, the impedance P1 of the load 3 is moved into the region P5 having a certain phase range as illustrated in FIG. 2.

Note that the table 19a of the calculation processing unit 19 stores, for each impedance P1 of the load 3, the phase shift amount φ that causes the impedance to enter the region P5 after the phase shifter 15 performs phase shift control.

In the example of FIG. 2, if the phase shift amount φ is about 110 degrees, the impedance enters the phase range of the region P5 after the phase shifter 15 performs phase shift control. Therefore, for example, if the impedance P1 of the load 3 is $P1_a$, about 110 degrees is stored in the table 19a as the phase shift amount $φ_a$ corresponding to the impedance $P1_a$.

Here, in the region P5, an end with the smallest phase angle (the upper end of the region P5 in the drawing) is the intersection of the constant conductance circle R2 passing through the point P3 having 50Ω in the Smith chart and the constant reflection coefficient circle R1 or a point with a larger phase angle than the intersection of the constant conductance circle R2 and the constant reflection coefficient circle R1.

In the region P5, the end with the largest phase angle (the lower end of the region P5 in the drawing) is a point with a smaller phase angle than the intersection of the constant reflection coefficient circle R1 and the real axis of the Smith chart.

Therefore, in the region P5, if the phase angle of the upper end of the region P5 is $θ_{P5min}[°]$, the region P5 has a phase range of $θ_{P5min}[°]$ to 180[°].

The reactance value L2 of the second variable reactance element 14 is set to the reactance value indicated by the control signal C2 output from the D/A converter 20 of the control circuit 16.

After the phase shifter 15 performs phase shift control, the second variable reactance element 14 transforms the impedance using the reactance value L2 set by the control circuit 16.

The reactance value L2 is a reactance value that causes the impedance to enter a region P6 after the second variable reactance element 14 performs impedance transformation.

Therefore, the table 19a of the calculation processing unit 19 stores, for each impedance P1 of the load 3, the reactance value L2 that causes the impedance to enter the region P6 after the second variable reactance element 14 performs impedance transformation.

As illustrated in FIG. 2, the impedance at the lower end of the region P5 is transformed to the impedance at the upper end of the region P6, and the impedance at the upper end of the region P5 is transformed to the impedance at the lower end of the region P6.

Therefore, the impedance at any point included in the region P5 is transformed to the impedance at the corresponding point in the region P6.

After the second variable reactance element 14 performs impedance transformation, the second transmission line 13 having an electrical length of a quarter wavelength at the frequency of a signal output from the signal source 1 transforms the impedance.

Consequently, the impedance in the region P6 is transformed to enter the region P7 as illustrated in FIG. 2.

The reactance value L1 of the first variable reactance element 12 is set to the reactance value indicated by the control signal C1 output from the D/A converter 20 of the control circuit 16.

After the second transmission line 13 performs impedance transformation, the first variable reactance element 12 transforms the impedance using the reactance value L1 set by the control circuit 16.

The reactance value L1 is a reactance value that causes the impedance to be transformed to a point P8 on the real axis of the Smith chart after the first variable reactance element 12 performs impedance transformation as illustrated in FIG. 2.

Therefore, the table 19a of the calculation processing unit 19 stores, for each impedance P1 of the load 3, the reactance value L1 that brings the impedance to the point P8 on the real axis of the Smith chart after the first variable reactance element 12 performs impedance transformation.

After the first variable reactance element 12 performs impedance transformation, the first transmission line 11 having an electrical length of a quarter wavelength at the frequency of a signal output from the signal source 1 transforms the impedance.

Consequently, the impedance at the point P8 is transformed to the point P3 having 50Ω as illustrated in FIG. 2.

The point P8, having the impedance after the first variable reactance element 12 performs impedance transformation, is uniquely determined by the region P5, which is the phase range having the impedance after the phase shifter 15 performs phase shift control. In particular, the point P8 is uniquely determined by the phase angle of the lower end of the region P5.

Therefore, a transmission line having the same characteristic impedance as the impedance at the point P8 is used as the second transmission line 13, and the line width of the second transmission line 13 can be uniquely determined if the region P5 is defined in advance. The second transmission line 13 can be used regardless of the impedance P1 of the load 3.

Since the first transmission line 11 has the function of transforming the impedance at the point P8 to the impedance at the point P3, the characteristic impedance of the first transmission line 11 is uniquely determined by the impedance at the point P8.

Specifically, the characteristic impedance of the first transmission line 11 is the geometric mean value of the impedance at the point P8 and the impedance at the point P3.

As apparent from the above description, according to the first embodiment, because the control circuit 16 is configured to detect the impedance P1 of the load 3 and control each of the reactance value L1 of the first variable reactance element 12, the reactance value L2 of the second variable reactance element 14, and the phase shift amount φ of the phase shifter 15 on the basis of the detected impedance P1, which is effective in achieving impedance matching even with the phase shifter 15 that performs discrete phase shift control.

That is, the phase shifter 15 does not need to shift the phase of the impedance P1 of the load 3 to one specific point, but only needs to cause the impedance P1 to enter the region P5 having a certain phase range, so that impedance mismatch due to the control accuracy of the phase shifter 15 can be resolved.

Figure 4:
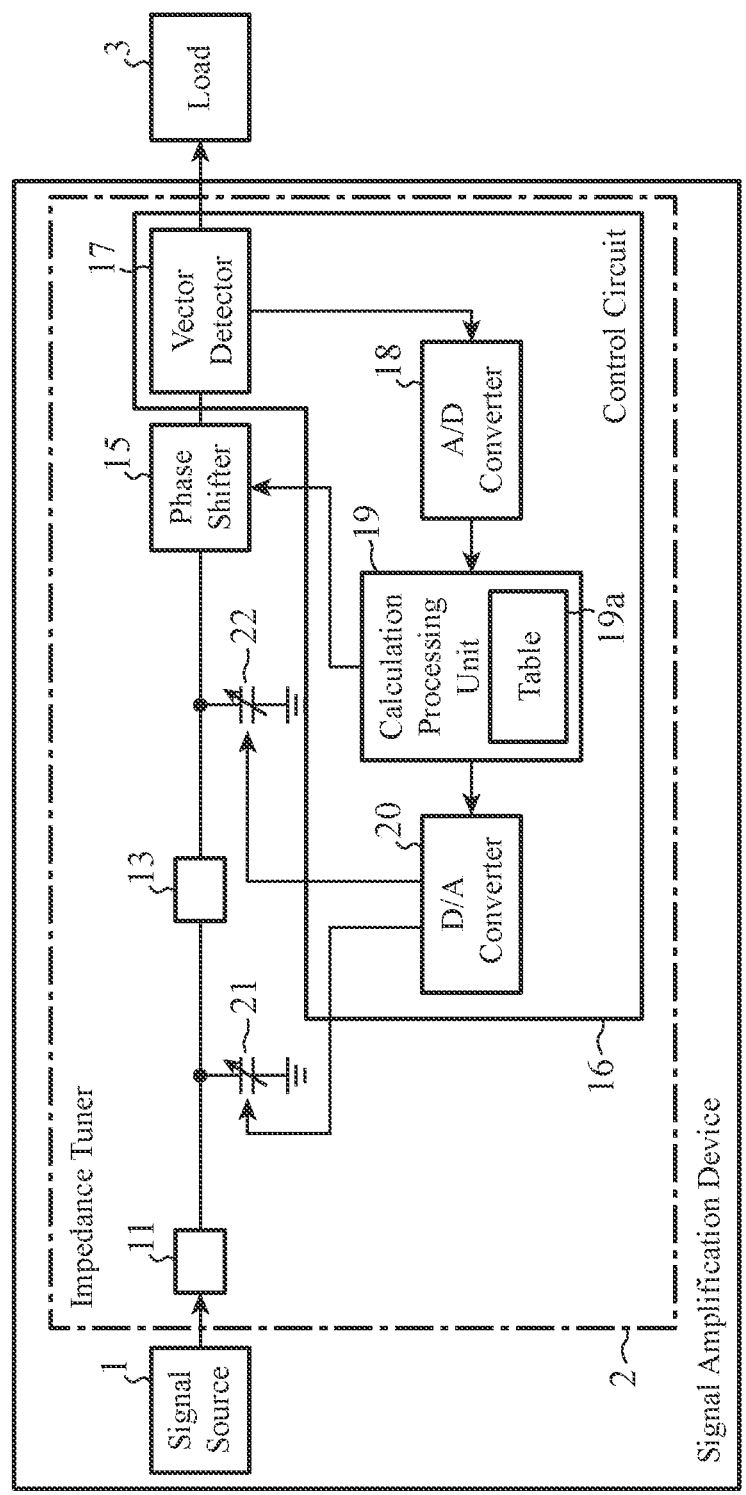
FIG. 4 is a configuration diagram illustrating a signal amplification device including another impedance tuner according to the first embodiment of the present invention.

Although the impedance tuner includes the first variable reactance element 12 and the second variable reactance element 14 in the example described in the first embodiment, each of the first variable reactance element 12 and the second variable reactance element 14 may be a variable capacitor as illustrated in FIG. 4.

FIG. 4 is a configuration diagram illustrating a signal amplification device including another impedance tuner according to the first embodiment of the present invention.

In FIG. 4, a variable capacitor 21 is used as the first variable reactance element 12, and a variable capacitor 22 is used as the second variable reactance element 14.

Varactor diodes can be used as the variable capacitors 21 and 22.

In the example of FIG. 4, the table 19a of the calculation processing unit 19 stores the capacitance value of the variable capacitor 21 as the reactance value L1 of the first variable reactance element 12 and stores the capacitance value of the variable capacitor 22 as the reactance value L2 of the second variable reactance element 14.

Second Embodiment

In the second embodiment, a specific configuration example of a phase shifter 30 provided in an impedance tuner will be described.

Figure 5:
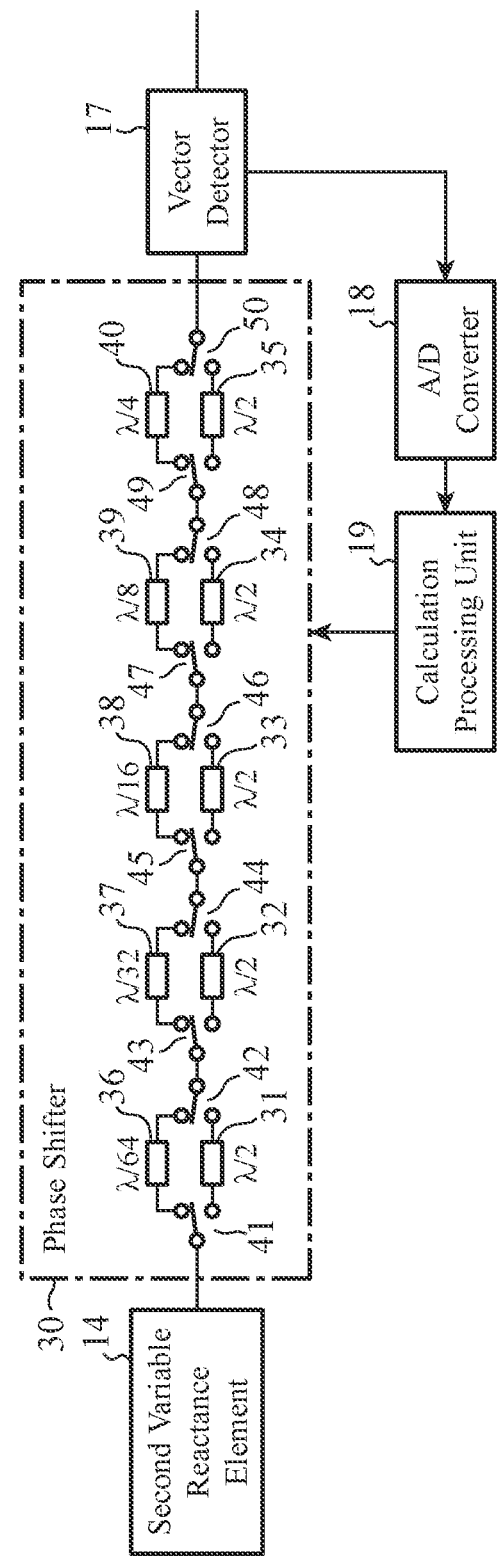
FIG. 5 is a configuration diagram illustrating a phase shifter 30 of an impedance tuner according to a second embodiment of the present invention.
Figure 6:
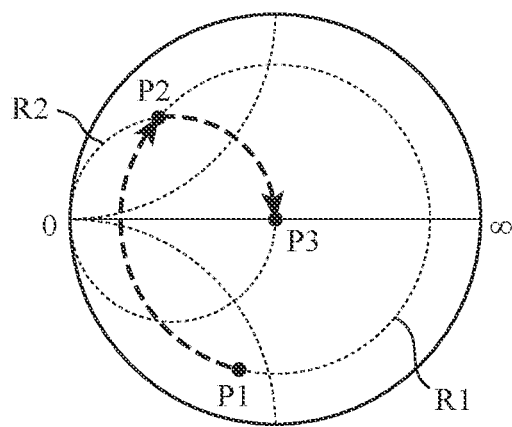
FIG. 6 is an explanatory diagram illustrating a state in which the impedance of a signal source and the impedance of a load are sufficiently matched.
Figure 7:
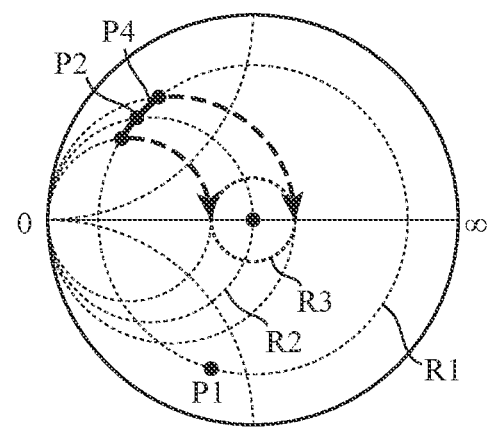
FIG. 7 is an explanatory diagram illustrating a state in which the accuracy of matching between the impedance of a signal source and the impedance of a load is degraded.

FIG. 5 is a configuration diagram illustrating the phase shifter 30 of the impedance tuner according to the second embodiment of the present invention. In FIG. 5, reference signs identical to those in FIGS. 1 and 4 designate identical or corresponding components, and the descriptions thereof are omitted.

In the same manner as the phase shifter 15 in the first embodiment above, the phase shifter 30 shifts the phase of a signal having passed through the second variable reactance element 14 and outputs the phase-shifted signal.

The phase shifter 30 includes transmission lines 31 to 40 that are connectable in series and switches 41 to 50 that select transmission lines to be connected in series from among the transmission lines 31 to 40.

The control circuit 16 controls the phase shift amount φ of the phase shifter 30 by controlling the selection of transmission lines at the switches 41 to 50.

The transmission lines 31 to 35 are transmission lines having an electrical length of a half wavelength at the frequency of a signal output from the signal source 1.

The transmission line 36 is a transmission line having an electrical length of 1/64 wavelength at the frequency of a signal output from the signal source 1.

The transmission line 37 is a transmission line having an electrical length of 1/32 wavelength at the frequency of a signal output from the signal source 1.

The transmission line 38 is a transmission line having an electrical length of 1/16 wavelength at the frequency of a signal output from the signal source 1.

The transmission line 39 is a transmission line having an electrical length of 1/8 wavelength at the frequency of a signal output from the signal source 1.

The transmission line 40 is a transmission line having an electrical length of a quarter wavelength at the frequency of a signal output from the signal source 1.

The switches 41 and 42 are changeover switches for selecting either the transmission line 31 or the transmission line 36.

The switches 43 and 44 are changeover switches for selecting either the transmission line 32 or the transmission line 37.

The switches 45 and 46 are changeover switches for selecting either the transmission line 33 or the transmission line 38.

The switches 47 and 48 are changeover switches for selecting either the transmission line 34 or the transmission line 39.

The switches 49 and 50 are changeover switches for selecting either the transmission line 35 or the transmission line 40.

Next, the operation will be described.

As in the first embodiment above, the calculation processing unit 19 of the control circuit 16 determines the phase shift amount φ of the phase shifter 30 and outputs the control signal C3 indicating the determined phase shift amount φ to the phase shifter 30.

The switches 41 to 50 of the phase shifter 30 set the phase shift amount φ of the phase shifter 30 by selecting transmission lines on the basis of the phase shift amount φ indicated by the control signal C3 output from the calculation processing unit 19.

In FIG. 5, the example of the phase shifter 30 in which the phase shift amount φ is represented by five bits is illustrated, but this is only one example, and the number of bits representing the phase shift amount φ can be increased or reduced by changing the number of transmission lines included in the phase shifter 30.

Note that the present invention allows within the scope thereof any combination of embodiments, modification of any component in each embodiment, or removal of any component from each embodiment.

INDUSTRIAL APPLICABILITY

The present invention is suitable for an impedance tuner and a signal amplification device including variable reactance elements and a phase shifter.

REFERENCE SIGNS LIST 1 signal source
2 impedance tuner
3 load
11 first transmission line
12 first variable reactance element
13 second transmission line
14 second variable reactance element
15 phase shifter
16 control circuit
17 vector detector
18 A/D converter
19 calculation processing unit
20 D/A converter
21, 22 variable capacitor
30 phase shifter
31 to 40 transmission line
41 to 50 switch

The invention claimed is:
1. An impedance tuner comprising:
a first transmission line connected at one end thereof to an output end of a signal source and having an electrical length of a quarter wavelength at a frequency of a signal output from the signal source;

a first variable reactance element connected at one end thereof to another end of the first transmission line;

a second transmission line connected at one end thereof to another end of the first variable reactance element and having an electrical length of a quarter wavelength at the frequency of the signal;

a second variable reactance element connected at one end thereof to another end of the second transmission line;

a phase shifter, connected at one end thereof to another end of the second variable reactance element, to shift a phase of the signal and output a phase-shifted signal to a load; and a control circuit to detect an impedance of the load and control each of reactance values of the first and second variable reactance elements and a phase shift amount of the phase shifter on a basis of the impedance.

2. The impedance tuner according to claim 1, wherein the control circuit includes a table indicating a relationship between the impedance of the load, and the reactance values of the first and second variable reactance elements, and the phase shift amount of the phase shifter, and determines, with reference to the table, each of the reactance values of the first and second variable reactance elements and the phase shift amount of the phase shifter corresponding to the impedance of the load.

3. The impedance tuner according to claim 1, wherein the control circuit controls each of the reactance values of the first and second variable reactance elements and the phase shift amount of the phase shifter in a manner as to cause the output end of the signal source to have an impedance of 50 ohms.

4. The impedance tuner according to claim 1, wherein a varactor diode is used as the first and second variable reactance elements.

5. The impedance tuner according to claim 1, wherein the phase shifter includes:

a plurality of transmission lines connectable in series; and a plurality of switches to shift transmission lines to be connected in series from among the plurality of transmission lines, and the control circuit controls the phase shift amount of the phase shifter by controlling selection of transmission lines at the plurality of switches.

6. A signal amplification device comprising:

an amplifier to amplify a signal;

a first transmission line connected at one end thereof to an output end of the amplifier and having an electrical length of a quarter wavelength at a frequency of a signal output from the amplifier;

a first variable reactance element connected at one end thereof to another end of the first transmission line;

a second transmission line connected at one end thereof to another end of the first variable reactance element and having an electrical length of a quarter wavelength at the frequency of the signal;

a second variable reactance element connected at one end thereof to another end of the second transmission line;

a phase shifter, connected at one end thereof to another end of the second variable reactance element, to shift a phase of the signal and output a phase-shifted signal to a load; and a control circuit to detect an impedance of the load and control each of reactance values of the first and second variable reactance elements and a phase shift amount of the phase shifter on a basis of the impedance.

* * * * *